United States Patent
Divakar et al.

(10) Patent No.: US 6,744,618 B2
(45) Date of Patent: Jun. 1, 2004

(54) ELECTROSTATIC CHUCKS WITH FLAT FILM ELECTRODE

(75) Inventors: Ramesh Divakar, Williamsville, NY (US); Morteza Zandi, Shrewsbury, MA (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 264 days.

(21) Appl. No.: 09/730,487

(22) Filed: Dec. 5, 2000

(65) Prior Publication Data

US 2001/0043452 A1 Nov. 22, 2001

Related U.S. Application Data

(60) Provisional application No. 60/169,859, filed on Dec. 9, 1999.

(51) Int. Cl.$^7$ .............................................. H02H 23/00
(52) U.S. Cl. ...................................... 361/234; 361/233
(58) Field of Search ............................... 361/233, 234; 279/128

(56) References Cited

U.S. PATENT DOCUMENTS

| | | | | |
|---|---|---|---|---|
| 3,740,133 A | * | 6/1973 | Komori et al. | 399/203 |
| 4,652,318 A | | 3/1987 | Masuda et al. | 156/89 |
| 4,778,778 A | | 10/1988 | Mallia et al. | 501/96 |
| 4,908,173 A | | 3/1990 | Schwetz et al. | 264/63 |
| 4,922,099 A | | 5/1990 | Masuda et al. | 250/324 |
| 4,992,253 A | | 2/1991 | Wu et al. | 423/412 |
| 5,280,156 A | | 1/1994 | Niori et al. | 219/385 |
| 5,306,895 A | | 4/1994 | Ushikoshi et al. | 219/385 |
| 5,320,990 A | | 6/1994 | Guiton et al. | 501/98 |

(List continued on next page.)

FOREIGN PATENT DOCUMENTS

| | | |
|---|---|---|
| EP | 0 360 529 A2 | 3/1990 |
| EP | 0 506 537 A1 | 9/1992 |
| EP | 0 680 075 A1 | 5/1995 |
| EP | 0771 772 A2 | 5/1997 |
| EP | 0 791 956 A2 | 8/1997 |
| EP | 0 855 764 | 7/1998 |
| EP | 0 856 881 A2 | 8/1998 |
| EP | 0 882689 A2 | 12/1998 |
| EP | 0 886 312 | 12/1998 |
| EP | 1 030 364 A2 | 8/2000 |
| WO | WO 97/35816 | 10/1996 |

OTHER PUBLICATIONS

Baker, H., et al., Eds., 3.56/Ternary Alloy Phase Diagrams, *ASM Handbook*, vol. 3 (1992).
Hansen, M., "Constitution of Binary Alloys," 482–483, 518–519, 968–969 and 1057–1059 (1958).
Hazelton, C., et al., "Effect of Neutron Radiation on the Dielectric, Mechanical and Thermal Properties of Ceramics for RF Transmission Windows," *Journal of Nuclear Materials* 253:190–195 (1998).
Kuramoto, N., et al., "Translucent A1N Ceramic Substrate," *IEEE Transactions on Components, Hybrids, and Manufacturing Technology* vol. CHMT–9:4:386–390 (1986).
Zulfequar, M. and Kumar, A., "Electrical Conductivity of Hot–pressed A1N Ceramic: Effecti of Various Oxide Additives," *Journal of Materials Science* 22:4056–4060 (1987).

*Primary Examiner*—Stephen W. Jackson
(74) *Attorney, Agent, or Firm*—Toler, Larson & Abel, LLP

(57) ABSTRACT

An electrostatic chuck having an essentially flat film electrode which is essentially parallel to the chucking surface of the electrostatic chuck is fabricated by depositing a film electrode, preferably by screen printing, onto a surface of a sintered ceramic substrate. A green ceramic layer is formed or molded onto the film electrode and the resulting structure is sintered, thereby producing the electrostatic chuck.

15 Claims, 2 Drawing Sheets

U.S. PATENT DOCUMENTS

| | | | |
|---|---|---|---|
| 5,343,150 A | 8/1994 | Nakahata et al. | 324/316 |
| 5,413,360 A | 5/1995 | Atari et al. | 279/128 |
| 5,522,131 A | 6/1996 | Steger | 29/829 |
| 5,541,145 A | 7/1996 | Harris et al. | 501/96 |
| 5,560,780 A | 10/1996 | Wu et al. | 118/728 |
| 5,607,541 A | 3/1997 | Kubota et al. | 156/538 |
| 5,633,073 A | 5/1997 | Cheung et al. | 428/209 |
| 5,677,253 A | 10/1997 | Inoue et al. | 501/98 |
| 5,705,450 A | 1/1998 | Chiao | 501/98 |
| 5,708,557 A | 1/1998 | Feigenbaum et al. | 361/234 |
| 5,728,635 A | 3/1998 | Kobayashi et al. | 501/98.4 |
| 5,753,132 A | 5/1998 | Shamouilian et al. | 216/33 |
| 5,800,618 A | 9/1998 | Niori et al. | 118/723 E |
| 5,817,406 A | 10/1998 | Cheung et al. | 428/210 |
| 5,880,922 A | 3/1999 | Husain | 361/234 |
| 5,880,924 A * | 3/1999 | Kumar et al. | 361/234 |
| 5,886,863 A | 3/1999 | Nagasaki et al. | 361/234 |
| 5,908,799 A | 6/1999 | Kobayashi et al. | 501/98.4 |
| 5,909,355 A | 6/1999 | Parkhe | 361/234 |
| 5,923,521 A | 7/1999 | Burkhart | 361/234 |
| 5,958,813 A | 9/1999 | Aida et al. | 501/98.4 |
| 6,174,583 B1 * | 1/2001 | Yamada et al. | 118/723 E |
| 6,537,667 B2 * | 3/2003 | Watanabe et al. | 428/403 |

* cited by examiner

ELECTROSTATIC CHUCKS WITH FLAT FILM ELECTRODE

RELATED APPLICATION

This application claims the benefit of U.S. Provisional Application No.: 60/169,859, filed Dec. 9, 1999, the entire teachings of which are incorporated herein by reference.

BACKGROUND OF THE INVENTION

Electrostatic chucks, and/or susceptors, are employed to support a wafer, substrate or another type of workpiece during the manufacture of semiconductor devices. In one arrangement, wafers are secured to a chucking surface by an electrostatic force generated between an external electrode and an electrode embedded in a dielectric chuck body.

One method for fabricating electrostatic chucks having an embedded film electrode includes forming a first layer of a green ceramic material, screen printing a film electrode onto the first layer, depositing a second layer of the green ceramic material over the screen printed electrode and sintering the resulting preform.

Resulting chucks and/or susceptors, however, can display fluctuations or non-uniformities in the thickness of the dielectric layer above the electrode in spite of careful machining of the chucking surface. These fluctuations can adversely affect the operation of the chuck especially in the case of chucks for which the chucking force is inversely proportional to the square of the distance between the electrode and the workpiece.

Therefore, a need exists for electrostatic chucks or susceptors which have an embedded screen printed electrode and which display an uniform chucking force across their chucking surface.

SUMMARY OF THE INVENTION

It has been found that an electrostatic chuck having a flat screen printed electrode can be formed by screen printing the electrode upon a densified ceramic substrate, followed by depositing a green form of a ceramic layer onto and overlaying the electrode and by sintering the resulting structure.

The invention is directed to an electrostatic chuck. The electrostatic chuck of the invention includes a chuck body having a film electrode and a chucking surface. The film electrode is essentially flat and parallel to the chucking surface. In a preferred embodiment, the film electrode is screen printed.

The invention also is directed to a method of producing an electrostatic chuck. The method of the invention includes depositing a film electrode on a surface of a sintered substrate. The surface of the sintered substrate can be smoothed by machining. A green layer of a ceramic material is formed onto and overlays the film electrode. The resulting structure is heated, optionally under pressure, thereby sintering the green layer and producing the electrostatic chuck.

In one embodiment of the invention, the sintered substrate is formed by sintering a green form of a ceramic material, such as, for example, a compacted powder. In another embodiment, the green layer of a ceramic material includes a compacted powder. In still another embodiment the film electrode is produced by screen printing.

Suitable film electrodes include a metal, such as, for example, molybdenum (Mo), tungsten (W), or combinations thereof. Suitable substrates include a ceramic material such as aluminum nitride, (AlN), alumina (aluminum oxide or $Al_2O_3$) boron nitride (BN), silicon nitride ($Si_3N_4$), combinations thereof and other materials. Suitable ceramic layers can include AlN, $Al_2O_3$, BN, $Si_3N_4$, combinations thereof and other materials. In a preferred embodiment, the substrate and the dielectric layer are fabricated from the same material.

The invention has several advantages. For example, the method of the invention does not require embedding a bulk metal electrode such as a foil, mesh or plate but can employ a screen printed electrode. Screen printing is particularly advantageous over bulk metal in conjunction with bipolar electrodes. A common bipolar electrode configuration is one where the inner electrode is concentric with but separated from the outer electrode by a defined gap (dielectric). Since it is important to maintain the separation of the two electrodes for the proper functioning of the electrostatic chuck, the screen printing process and the resulting electrode allows for the accurate definition and achievement of a uniform dielectric gap in bipolar configurations as compared to bulk metal electrodes. A similar advantage exists for screen printed electrodes where electrostatic chucks are designed with multipolar electrode configurations, for example, six independent electrodes. The film electrode obtained by the method of the invention is flat and the electrostatic chuck of the invention has good chucking properties and can exert an uniform chucking force upon a workpiece during wafer manufacturing.

DETAILED DESCRIPTION OF THE INVENTION

The features and other details of the invention, either as steps of the invention or as combination of parts of the invention, will now be more particularly described with reference to the accompanying drawings and pointed out in the claims. The same numeral present in different figures represent the same item. It will be understood that the particular embodiments of the invention are shown by way of illustration and not as limitations of the invention. The principle feature of this invention may be employed in various embodiments without departing from the scope of the invention.

The invention relates to an electrostatic chuck or susceptor. The terms "electrostatic chuck" and "susceptor" are used herein interchangeably. The electrostatic chuck includes a chuck body having a chucking surface. A film electrode is embedded in the chuck body and is essentially flat and parallel to the chucking surface.

Figure 1:
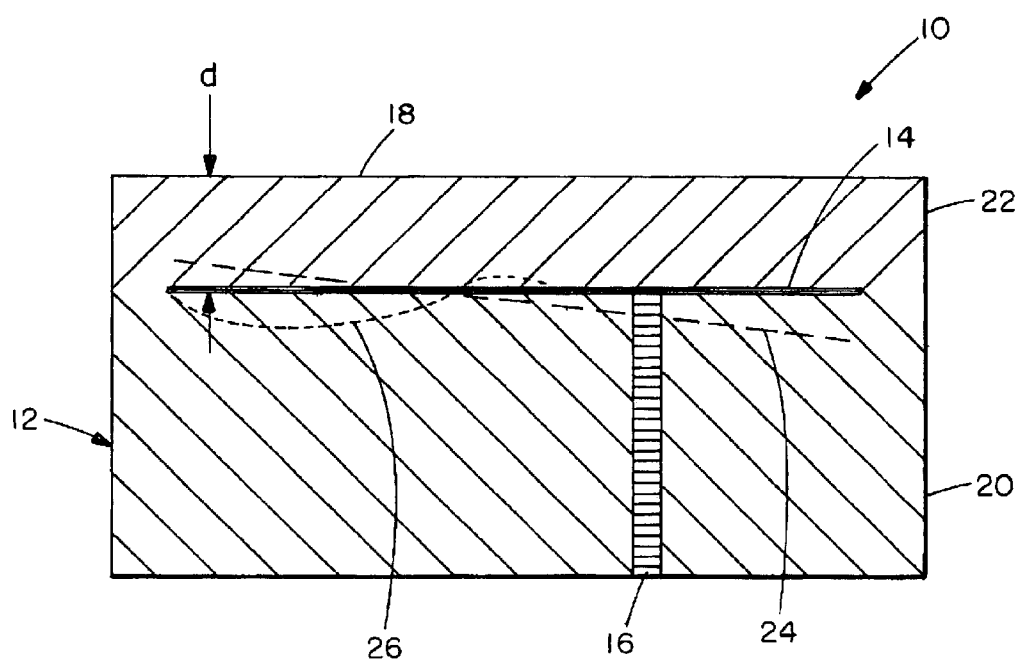
FIG. 1 is a vertical cross-sectional diagram of one embodiment of the electrostatic chuck, or susceptor, of the invention.

FIG. 1 is a schematic diagram of electrostatic chuck 10, of one embodiment of the invention. Electrostatic chuck 10 includes chuck body 12 and film electrode 14, embedded in chuck body 12. Electrostatic chuck 10 can be, for example, of Coulombic type or of Johnson-Rahbek type. During operation, electrostatic chuck 10 is positioned through mechanical supports (not shown in FIG. 1) in a process chamber (also not shown). Voltage is applied to electrode 14 through electrical contact 16, connecting electrode 14 to a power supply (not shown in FIG. 1), thereby securing a workpiece, such as, for example, a semiconductor wafer, (also not shown in FIG. 1) to chucking surface 18.

Chuck body 12 includes two regions or portions: sintered substrate 20, below film electrode 14, and dielectric layer 22, above film electrode 14. Generally, dielectric layer 22 is from about 50 to about 5000 micrometer (micron or μm) thick. In one embodiment, both sintered substrate 20 and dielectric layer 22 have the same composition. In another embodiment, the composition of sintered substrate 20 differs from that of dielectric layer 22. Suitable materials for fabricating chuck body 12 are further described below.

A screen printed film electrode 14 is preferred. Film electrode 14 can be used in an electrostatic chuck operating in the Coulombic or in the Johnson Rahbek mode. Examples of other film electrodes include, but are not limited to, plasma generating and radio frequency (RF) electrodes.

Broken line 24 is an illustration of an electrode which is deflected with respect to chucking surface 18. Dotted line 26 is an illustration of a wavy or undulating electrode shape.

In contrast to those shapes, film electrode 14 is essentially flat and parallel to chucking surface 18. As used herein, dielectric thickness or dielectric layer thickness of an electrostatic chuck is defined as the distance between the embedded electrode and the chucking surface of the chuck, i.e., its surface. In the case of film electrode 14, which is essentially flat and parallel to chucking surface 18, dielectric thickness d is essentially uniform, as further described below and in Examples 1–8

Dielectric thickness d can be measured at different points across electrostatic chuck 10. Variations in d can be expressed in terms of standard deviation for a set of measurements. A range representing the difference between the minimum dielectric thickness and the maximum dielectric thickness over the entire chucking surface also can be determined from these measurements. In comparison to standard deviation, range takes into account the outliers which do not impact standard deviation significantly but which can indicate that a risk of exposing the electrode through the dielectric exists.

Essentially flat electrodes which are essentially parallel to the chucking surface, or electrostatic chucks having an essentially uniform dielectric thickness d are characterized by small standard deviations and a small ranges. Generally, the electrostatic chucks of the invention present standard deviations and ranges which are smaller than those observed in comparable electrostatic chucks which employ bulk metal electrodes. Examples of bulk metal electrodes include mesh, plate, foil, perforated plate or perforated foil electrodes and others known in the art. As used herein, "essentially uniform dielectric thickness" or "essentially uniform dielectric layer thickness" refer to a variation in the thickness of the dielectric layer expressed either as a range which is less than about 700 microns or as a standard deviation which is less than about 160 microns. In one embodiment, the electrostatic chucks of the invention have a dielectric thickness variation expressed as a range which is less than about 700 μm, preferably less than about 300 μm. In another embodiment, the electrostatic chucks of the invention have dielectric thickness variation expressed as a standard deviation which is less than about 160 μm, preferably less than about 90 μm.

Figure 2A:
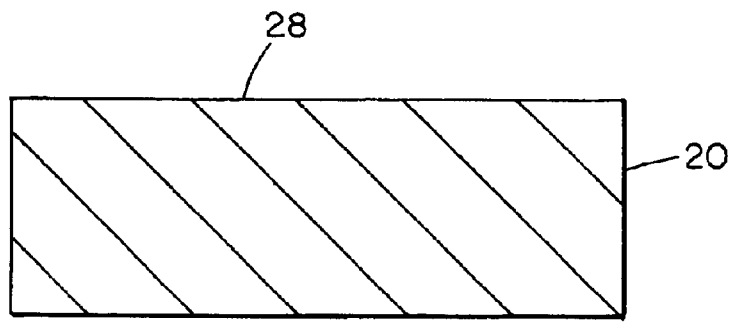
FIGS. 2A–2C are a schematic view of the steps employed by one method of the invention.
Figure 2B:
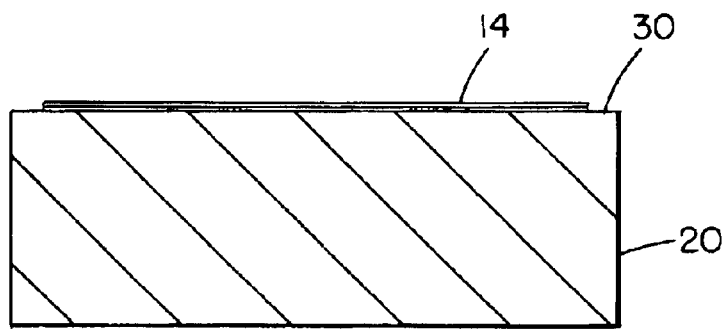
Figure 2C:
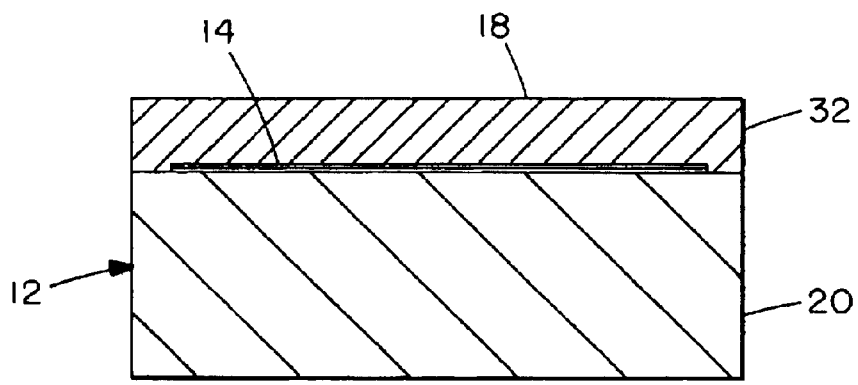

The invention also relates to a method for producing an electrostatic chuck. Stages of one embodiment of the method are shown in FIGS. 2A–2C. As shown in FIG. 2A, sintered substrate 20 has a substrate surface 30. As used herein, "sintered" refers to a material or article having a dense, coherent mass. Sintered substrate 20 can be produced by shaping or molding a green ceramic material into a suitable form or dye, followed by sintering. As used herein, the term "green" refers to a pre-densified state of a ceramic precursor. In a preferred embodiment, the sintered substrate is produced by compacting a ceramic powder, for example by hot pressing, followed by sintering and, optionally, by heat treating, as further described below.

A flat smooth substrate surface 30, free of irregularities, corrugations, asperities, waves or undulations, is preferred. Such a surface can be prepared by machining, for example, by grinding, polishing or smoothing the sintered substrate, as is known in the art.

Film electrode 14 is formed onto substrate surface 30 as shown in FIG. 2B. Film electrode 14 includes a metal, such as, but not limited to, Mo, W or combinations thereof. Other suitable metals for fabricating electrode 14 include but are not limited to, hafnium, niobium, alloys thereof and others. In one embodiment of the invention, film electrode 14 includes an alloy of a first metal, such as described above, and a second metal, such as, for example, nickel, cobalt and others, wherein all the second metal is essentially dissolved in the first metal. In a preferred embodiment, all the second metal is essentially dissolved in the first metal. Examples of preferred first-second metal compositions are described in U.S. patent application Ser. No. 09/457,968, Electrostatic Chuck, Susceptor and Method for Fabrication, filed on Dec. 9, 1999, the entire contents of which are incorporated herein by reference.

In a preferred embodiment, film electrode 14 is formed by screen printing. Screen printing is known in the art. A general description of screen printing is presented, for example, in Screens and Screen Printing, published by the International Society for Hybrid Microelectronics, 1991, incorporated herein by reference, in its entirety. Screen printing an electrode onto a green sheet is described in U.S. Pat. No. 4,922,099, issued to Masuda et al. on May 1, 1990, also incorporated herein by reference in its entirety. In one embodiment of the invention, a paste including tungsten, molybdenum or alloys thereof is employed to form electrode 14. A silk screen or other fine mesh can be used. Many conventional pastes for silk screening contain glass frit, added to the paste to promote adhesion. In a preferred embodiment of the invention, film electrode 14 is formed by employing silk screening glass-free conductive pastes. In comparison with conventional pastes which contain glass frit, electrodes fabricated with glass-free pastes have significantly lower resistivity, thus preventing film electrode 14 from heating up when used as a plasma generating (RF) electrode or as a chucking electrode.

Film electrode 14 also can be formed by vapor deposition techniques, such as, for example, chemical vapor deposition (CVD) or physical vapor deposition (PVD). These techniques also are known in the art. Films produced by screen printing often are referred to as "thick" films, whereas films produced by vapor deposition often are referred to as "thin" films. Thick films are preferred. Preferably, film electrode 14 has a thickness ranging from about 50 microns to about 250 microns.

Green layer 32 of a ceramic material is formed (molded, shaped) onto and overlaying film electrode 14, as shown in FIG. 2C. In a preferred embodiment, green layer 32 is formed by compacting, for example by cold pressing, a ceramic powder material.

Suitable ceramic materials which can be employed in forming either or both sintered substrate 20 and green layer 32 include, but are not limited to, AlN, $Al_2O_3$, BN, $Si_3N_4$, combinations thereof, as well as other ceramic materials. AlN is preferred. Powder ceramic materials such as, for example, commercial and technical grades of ceramic powders can be employed. High purity powders are preferred as described in U.S. patent application Ser. No. 09/458,278, titled High-Purity Low-Resistivity Electrostatic Chuck, filed on Dec. 9, 1999, the entire contents of which are incorporated herein by reference.

The powders can further include sintering aids, metal or carbon dopants and impurities. In the case of AlN, examples of suitable sintering aids include, but are not limited to, yttria ($Y_2O_3$), calcium fluoride ($CaF_2$), calcium oxide (CaO), calcium carbonate ($CaCO_3$) and others. Metal dopants can include iron, copper, nickel, zinc, chromium, cobalt, sodium, potassium, magnesium, calcium, titanium, vanadium, zirconium. AlN powders can also include silicon and boron impurities.

The resulting assembly is heated, thereby sintering green layer 32 of ceramic material into dielectric layer 22 and forming electrostatic chuck 10 shown in FIG. 1. Sintering can be in the absence of pressure (pressureless sintering). Hot pressing is preferred. The sintering temperature can depend on the particular materials employed in the fabrication of the electrostatic chuck. In the case of an AlN compacted powder, the sintering temperature ranges from about 1500° C. to about 2000° C. If sintering is conducted under pressure, the pressure can range from about 10 MPa to about 40 MPa. Sintering can be under an inert atmosphere, as described in U.S. patent application Ser. No. 09/458,278, titled High-Purity Low-Resistivity Electrostatic Chuck, filed on Dec. 9, 1999, the entire contents of which are incorporated herein by reference.

Optionally, the resulting electrostatic chuck can be heat treated. Heat treating can be conducted at a soak temperature, in an atmosphere and for a period of time suitable to the particular materials employed in fabricating the chuck. For AlN, for example, heat treating can be at a soak temperature in excess of 1000° C. but lower than the sintering temperature. Periods of time ranging from 0.5 to several hours and an inert atmosphere can be employed. In a preferred embodiment, dielectric layer 22 includes AlN and heat treating is under an argon atmosphere, as described in U.S. patent application Ser. No. 09/458,278, titled High-Purity Low-Resistivity Electrostatic Chuck, filed on Dec. 9, 1999, the entire contents of which are incorporated herein by reference.

Chucking surface 18 of electrostatic chuck 10 can be smoothed by polishing, grinding, or by other methods known in the art.

The method can further include forming electrical contact 16. Methods for forming an electrical contact 16 at electrode 14 are known in the art. For example, a hole can be drilled through substrate 20, exposing a portion of electrode 14. Electrical contact 16 can be brazed at electrode 14, using braze materials known in the art. In one embodiment, electrical contact 16 includes an alloy having one metal in common with electrode 14. Furthermore, electrical contact 16 is essentially free of intermetallic compounds and/or other additional phases. A preferred electrical contact metallurgy is described in U.S. patent application Ser. No. 09/457,968, Electrostatic Chuck, Susceptor and Method for Fabrication, filed on Dec. 9, 1999, the entire teachings of which are incorporated herein by reference.

Dielectric thickness uniformity in an electrostatic chuck is a key contributor to improved chucking performance. More specifically, the chucking and de-chucking response is more uniform. When the electrode also functions as a radio frequency (RF) electrode, the RF coupling of the wafer is improved with a uniform dielectric thickness. Finally, the smaller variation in dielectric thickness allows for the dielectric thickness itself to be decreased without the risk of locally exposing the electrode on the dielectric surface (and thus causing a short circuit). Without wishing to be bound to any particular theory, it is believed that screen printing onto a sintered substrate eliminates warping, undulations and inclinations which can be observed with electrodes screen printed unto a green substrate.

The invention is further described through the following examples which are provided for illustrative purposes and is not intended to be limiting.

EXEMPLIFICATION

Examples 1–3

Three types of AlN based monopolar electrostatic chucks were fabricated: (a) incorporating a molybdenum (Mo) mesh electrode containing 50 wires per inch with a wire diameter of 125 $\mu$m, (b) incorporated a screen printed Mo electrode, and (c) incorporating a screen printed electrode containing 99.8% Mo and 0.2% Ni by weight. The sintered thickness of the screenprinted electrodes was approximately 135 $\mu$m In the case of the Mo mesh bulk metal electrode the mesh electrode was sandwiched between a first green compact of AlN constituting the bottom portion of the chuck body and a second green compact constituting the dielectric part (top portion) of the chuck body and the assembly was densified via hot pressing at 1850° C. at a pressure of 20 MPa in a graphite die/sleeve body. The dielectric portion was incorporated in the green body by compacting AlN powder on top of the Mo mesh electrode which in turn was placed on top of the bottom green compact.

In the case of the screen printed electrodes (either Mo or Mo—Ni), the respective electrodes are screen printed on an already densified bottom portion which had been further machined so that its surfaces was flat and parallel. Additional AlN powder was compacted on top of the electrode and the assembly was hot-pressed as above in order to produce a dense chuck body with appropriate embedded electrodes.

The top and bottom surfaces of the above chucks were machined in an identical manner to render them as flat and parallel as possible. Next, an eddy current probe was used to measure the dielectric thickness at 25 specified points on each chuck. The dielectric thickness variation was characterized by two parameters, (i) a standard deviation of each set of measurements, and, (ii) a range representing the difference between the minimum dielectric thickness and the maximum dielectric thickness over the entire chucking surface. A smaller standard deviation and range imply less variation in dielectric thickness. The range takes into account the outliers. While these may not impact the standard deviation significantly; they may indicate that a risk of exposing the electrode through the dielectric exists.

The results are shown in Table 1.

TABLE 1

| Example | Electrode Type | Standard Deviation, $\mu$m | Range (Max–Min), $\mu$m |
| --- | --- | --- | --- |
| 1 | Mo mesh | 190 | 872 |
| 2 | Screen Printed Mo | 150 | 620 |
| 3 | Screen Printed Mo—Ni | 90 | 395 |

It can be clearly seen that either screen printed electrode is significantly flatter and more parallel to the chucking surface, i.e., has a more uniform dielectric thickness than obtained with the embedded bulk metal mesh electrode, as indicated by the lower standard deviation and range. Without wishing to be tied to any particular theory, it is believed that the screen-printed electrodes conform extremely well to the dense substrates they are printed on and maintain this conformance throughout the densification process. On the other hand, the mesh-based electrodes do not conform well to the green substrate on which they are placed. In addition, wire mesh structures are usually manufactured and stored in rolls—thus the electrodes made from them may have a tendency to curl up during the densification of the chuck body.

Of the two types of screen-printed electrodes, the Mo—Ni electrode had improved flatness with respect to the Mo electrode. Without wishing to be tied to any particular theory, it is believed that the Mo—Ni metallurgy promotes diffusion bonding between the electrode and the substrate during the densification process of both the chuck body and the embedded electrode and thus conforms much better to the substrate than even the Mo electrode.

Examples 4–6

AlN electrostatic chucks using another monopolar electrode design were fabricated. Once again three types of AlN based electrostatic chucks were made: (a) incorporating a Mo mesh electrode containing 30 wires per inch with a wire diameter of 210 $\mu$m, (b) incorporated a screen printed Mo electrode, and (c) incorporating a screen printed electrode containing 99.8% Mo and 0.2% Ni by weight. The sintered thickness of the screen-printed electrodes was approximately 105 $\mu$m.

The same procedure as above was used to characterize dielectric thickness variation or flatness. The only difference was that 34 specified points were used in these measurements. Results are shown in Table 2.

TABLE 2

| Example | Electrode Type | Standard Deviation, $\mu$m | Range (Max–Min.), $\mu$m |
| --- | --- | --- | --- |
| 4 | 30 × 30 Mo mesh | 219 | >800 |
| 5 | Screen Printed Mo | 155 | 490 |
| 6 | Screen Printed Mo—Ni | 85 | 382 |

Some points on this chuck had a dielectric thickness exceeding 1.4 mm which was beyond the range of the eddy current probe used. These points were excluded from the standard deviation.

It can be clearly seen that chucks in examples 5 and 6 have more uniform dielectric thicknesses than that in example 4, i.e., screen printed electrodes result in dramatically reduced dielectric thickness variation compared to a bulk metal mesh electrode as indicated by the lower standard deviation and range.

Examples 7–8

Two additional AlN based electrostatic chucks were fabricated using screen printed electrodes (one monopolar and the other bipolar) as in the Examples 1–2, except for the following two changes to the procedure. First, the AlN powder added on top of the electrode was screened through a coarse sieve (30 mesh) to remove agglomerates. Second, care was taken to ensure that the AlN powder was evenly distributed on top of the electrode. Both of these steps were taken to ensure that a uniform density and consistency were obtained in the green compact above the electrode. The assembly was hot-pressed as in Examples 1–3. Results from dielectric thickness measurements on the electrostatic chucks so produced are shown in Table 3.

TABLE 3

| Example | Electrode Type | Standard Deviation, $\mu$m | Range (Max–Min.), $\mu$m |
| --- | --- | --- | --- |
| 7 | Monopolar: Screen Printed Mo—Ni | 53 | 260 |
| 8 | Bipolar: Screen Printed Mo—Ni | 56 | 240 |

As can be seen from the above data both types of electrodes were incorporated into electrostatic chucks characterized by excellent dielectric thickness uniformity. In addition, the bipolar electrode showed excellent gap consistency and alignment between the inner and the outer electrodes.

Equivalents

Those skilled in the art will recognize, or be able to ascertain using no more than routine experimentation, many equivalents to the specific embodiments of the invention described specifically herein. Such equivalents are intended to be encompassed in the scope of the following claims.

What is claimed is:

1. A method of producing an electrostatic chuck comprising the steps of:
   a) screen printing a film electrode onto a surface of a sintered substrate;
   b) forming a green ceramic layer onto and overlaying the film electrode; and
   c) sintering the green ceramic layer under pressure, thereby forming the electrostatic chuck, wherein a dielectric layer is formed between the film electrode and a chucking surface, and wherein thickness of the dielectric layer has a variation expressed as a range which is smaller than about 300 microns.

2. The method of claim 1 wherein the sintered substrate includes aluminum nitride.

3. The method of claim 1 wherein the green ceramic layer includes aluminum nitride.

4. The method of claim 1 wherein the film electrode includes a first metal selected from the group consisting of molybdenum, tungsten and any combination thereof.

5. The method of claim 4 wherein the film electrode further includes a second metal selected from the group consisting of nickel, cobalt and any combination thereof.

6. The method of claim 5 wherein the second metal is essentially dissolved in the first metal.

7. The method of claim 1 wherein screen printing includes silk screening glass-free conductive pastes.

8. The method of claim 1 wherein agglomerates are removed prior to forming the green ceramic layer.

9. The method of claim 1 wherein the green ceramic layer is evenly distributed onto the film electrode.

10. The method of claim 1 wherein hot pressing is in an inert atmosphere.

11. The method of claim 1 further including heat treating in an atmosphere consisting essentially of argon.

12. An electrostatic chuck produced by a method comprising the steps of:
   a) screen printing a film electrode onto a surface of a sintered substrate;
   b) forming a green ceramic layer onto and overlaying the film electrode; and c) sintering the green ceramic layer under pressure, thereby forming the electrostatic chuck, wherein a dielectric layer is formed between the film electrode and a chucking surface, and wherein thickness of the dielectric layer has a variation expressed as a range which is smaller than about 300 microns.

13. A method of producing an electrostatic chuck comprising the steps of:
   a) depositing a film electrode by a process selected from the group consisting of chemical vapor deposition and physical vapor deposition onto a surface of a sintered substrate;
   b) forming a green ceramic layer onto and overlaying the film electrode; and
   c) sintering the green ceramic layer under pressure, thereby forming the electrostatic chuck, wherein a dielectric layer is formed between the film electrode and a chucking surface, and wherein thickness of the dielectric layer has a variation expressed as a range which is smaller than about 300 microns.

14. An electrostatic chuck produced by the method of claim 13.

15. A method of producing an electrostatic chuck comprising the steps of:
   a) screen printing a film electrode onto a surface of a sintered substrate, wherein the film electrode includes a first metal and a second metal, all the second metal being essentially dissolved in the first metal;
   b) forming a green ceramic layer onto and overlaying the film electrode; and
   c) sintering the green ceramic layer under pressure, thereby forming the electrostatic chuck, wherein a dielectric layer is formed between the film electrode and a chucking surface, and wherein thickness of the dielectric layer has a variation expressed as a range which is smaller than about 300 microns.

* * * * *